United States Patent [19]

Ohta

[11] Patent Number: 4,494,131
[45] Date of Patent: Jan. 15, 1985

[54] JOSEPHSON JUNCTION ELEMENT AND METHOD OF MAKING THE SAME

[75] Inventor: Hiroshi Ohta, Wako, Japan

[73] Assignee: Rikagaku Kenkyusho, Japan

[21] Appl. No.: 315,505

[22] Filed: Oct. 27, 1981

Related U.S. Application Data

[63] Continuation-in-part of Ser. No. 151,693, May 20, 1980, Pat. No. 4,366,494.

[30] Foreign Application Priority Data

| Oct. 31, 1980 | [JP] | Japan | 55-153464 |
| Dec. 20, 1980 | [JP] | Japan | 55-181045 |
| Dec. 20, 1980 | [JP] | Japan | 55-181046 |
| Dec. 20, 1980 | [JP] | Japan | 55-181047 |

[51] Int. Cl.$^3$ .............. H01L 27/12; H01L 45/00; H01L 49/02; H01L 39/22
[52] U.S. Cl. .................... 357/5; 357/4; 357/55; 307/306
[58] Field of Search .......... 357/5, 55, 4; 307/306; 324/248

[56] References Cited

U.S. PATENT DOCUMENTS

| 3,852,795 | 12/1974 | Domes | 357/5 |
| 4,157,555 | 6/1979 | Gray | 307/306 |
| 4,176,290 | 11/1979 | Ishida et al. | 357/5 |
| 4,344,052 | 8/1982 | Davidson | 357/5 |
| 4,366,494 | 12/1982 | Ohta | 357/4 |
| 4,386,361 | 5/1983 | Simmonds | 357/5 |

FOREIGN PATENT DOCUMENTS

| 55-7711 | 2/1980 | Japan | 357/5 |
| 55-7712 | 2/1980 | Japan | . |

OTHER PUBLICATIONS

"Tomorrows Circuit Technique: Computer in the Freezer" Elektro (Norway) vol. 91 (1978), pp. 19-21
A. F. Hebard et al., "Diagnostics with Series-Connected Josephson Tunnel Junctions", Journal of Applied Physics, vol. 49 (1978), pp. 338-343.
IEEE Transactions on Electron Devices, vol. ED-27, No. 10, Oct. 1980, Entitled "A New Josephson Junction with a Very Short Barrier Length and a Very Low Capacitance" by Hiroshi Ohta.
IEEE Transactions on Magnetics, vol. Mag.-17, No. 1, Jan. 1, 1981, Entitled "Semimetal-Barrier Quasi-Planar Josephson Junction" by Hiroshi Ohta.

Primary Examiner—Andrew J. James
Assistant Examiner—J. Carroll
Attorney, Agent, or Firm—Brumbaugh, Graves, Donohue & Raymond

[57] ABSTRACT

A Josephson junction element which comprises a substrate, a first strip-like superconductor thin film layer arranged on said substrate, a second strip-like superconductor thin film layer arranged on said first superconductor layer in crossing relation thereto, an insulator layer disposed between said first and second superconductor layer at the crossing area and a weak link portion connecting said first and second layer together across the sides of the thickness of said insulator layer. A method for manufacturing such Josephson junction element.

6 Claims, 41 Drawing Figures

JOSEPHSON JUNCTION ELEMENT AND METHOD OF MAKING THE SAME

This application is a continuation-in-part of my prior copending U.S. application Ser. No. 151,693 filed May 20, 1980, now U.S. Pat. No. 4,366,494.

The present invention relates to a Josephson junction element having superior electrical characteristics which can be easily manufactured and a method for manufacturing such Josephson junction element.

A Josephson junction element has wide application many in technical fields. It has been proposed to use the Josephson element as an switching element of a computer of low power dissipation and ultra-high speed, a detector having high sensitivity and high speed response for detecting microwaves, millimeter waves or the like, a detector for detecting feeble magnetic fields emitted from human brain, heart or the like, or a voltage standard, and the needs for mass-producing the same have been increasing day by day.

Recently, the inventor has proposed a novel construction of a Josephson junction element (Josephson junction element of quasi-planar type) which can be manufactured in mass-production scale to easily produce a large quantity of elements having the same characteristics (U.S. Pat. No. 4,366,494). As shown in FIG. 1, the Josephson junction element of the quasi-planar type comprises a substrate 1, two superconductor layers 2 and 3 arranged on said substrate and partially confronting with each other through an insulator layer 4 and a weak link member 5 extending from the top superconductor layer to the bottom superconductor layer across said insulator layer 4. In such construction, the length of the weak link portion is equal to the thickness of the very thin insulator layer 4, and consequently the length of the weak link portion can be precisely controlled to a very small value by adjusting the time of sputtering or vacuum deposition of an insulating material at the time of forming said insulator layer.

In practice, the insulator layer 4 having thickness of the order of few hundred Å is formed by sputtering an insulating material or semiconductor material, for example $SiO_2$, on the superconductor thin film 2 having thickness of the order of few hundred to few thousand Å or oxidizing the surface of the superconductor layer 2 in an oxidizing atmosphere. The weak link portion 5 is formed by sputtering a suitable barrier material to the thickness of a few hundred to a few thousand Å over the top and bottom superconductor thin films 2 and 3 across the thickness of the insulator layer 4. Barrier materials suitable for use in forming a weak link are well known in the art and as described, for example, in my copending application Ser. No. 151,693, now U.S. Pat. No. 4,366,494, any kind of superconducting material, copper, and other normal metals, semiconductor materials doped with tellurium or other impurities, or bismuth or other semimetals may be selectively used to form a weak link. Thus the length of the weak link portion 5 connecting the top and bottom superconductor layers 2 and 3 is equal to the thickness of the insulator layer 4, and a proper value of the length can be selected within the range from a few hundred to a few thousand Å depending upon the value of impedance as required.

Such construction provides the following advantages.

1. The length of the weak link portion can be reduced to an extremely small length, while maintaining large thickness of the superconductor film layers 2 and 3 at the electrode portion, whereby the product of $I_m \cdot R_j$ can be considerably increased.

2. The weak link portion can be formed of various materials.

3. The electrostatic capacity can be reduced.

4. Long life can be obtained by forming said superconductor layer 3 of a material other than lead alloy, such as Nb or the like.

5. The element can be easily manufactured in mass-production scale by using photolithography or electronic beam lithography.

As one of the major characteristics of the Josephson junction element of quasi-planar type, the electrostatic capacity depends upon the area $a \times b$ of the confronting portions of the superconductor layers 2 and 3 which are confronting with each other through the insulator layer 4 positioned therebetween, so that the electrostatic capacity decreases as the area $a \times b$ is decreased. The junction resistance $R_j$ and the critical current $I_m$ depend upon the width C of the weak link portion which extends across the side of the thickness of the insulator layer 4, so that the junction resistance $R_j$ increases while the critical current $I_m$ decreases, as the width C is decreased.

FIGS. 2A, 2B and 2C show the relationship between the critical current $I_m$ and the junction resistance $R_j$ where the width C is varied while the area $a \times b$ is maintained constant (that is, the electrostatic capacity is maintained constant). It will be seen that as the width C is increased, the critical current $I_m$ increases while the junction resistance $R_j$ decreases, as shown by the progression from FIG. 2A to FIG. 2C.

As seen from FIG. 1, the Josephson junction element of quasi-planar type has such construction that a misalignment of masks (in X-direction or Y-direction) directly leads to a deviation of the area $a \times b$, which causes various problems as follows.

(a) It is difficult to decrease the electrostatic capacity of the element to considerable extent (that is, it is difficult to decrease a and b to values lower than 1 $\mu$m).

(b) The characteristics of the element (particularly, the electrostatic capacity) tends to vary widely.

(c) It is difficult to decrease the electrostatic capacity and increase the junction resistance $R_j$ (to obtain the characteristics as shown in FIG. 2A).

Furthermore the element which is formed in shape as shown in FIG. 1 causes the following problems.

(d) It is difficult to increase the critical current $I_m$, while maintaining the size of the element small (to obtain the characteristics as shown in FIG. 2C).

(e) It is difficult to obtain the construction which is superior in its magnetic-field dependent property, while maintaining the size of the element small.

It is an object of the present invention to provide a Josephson junction element of quasi-planar type which has a decreased tendency of producing variation of characteristics dependent upon the precision of mask alignment, which can be easily manufactured and which has a considerably decreased electrostatic capacity.

It is another object of the present invention to provide a Josephson junction element of quasi-planar type in which the junction resistance $R_j$ can be large, while maintaining electrostatic capacity small, and a method for manufacturing such Josephson junction element.

It is a further object of the present invention to provide a Josephson junction element of quasi-planar type in which the critical current $I_m$ can be large, while maintaining the size of the element small.

It is a further object of the present invention to provide a Josephson junction element of quasi-planar type which is superior in its magnetic field dependent property, while maintaining the size of the element small, and a method for manufacturing such Josephson junction element.

These objects can be attained by the construction in which two strip-like superconductor films are arranged in crossing relation with each other, with an insulator layer being disposed therebetween, and said top and bottom superconductor films are connected together, at the respective opposing edges of the crossing area thereof, across the sides of the thickness of said insulator layer by means of a weak link portion.

Furthermore, the objects of the present invention can be attained by the construction in which said weak link portion is formed by one or two linear weak link portions.

Furthermore, the objects of the present invention can be attained by the construction in which a plurality of grooves or apertures are formed in the laminated body of the above-mentioned top superconductor layer and insulator layer, and the top and bottom superconductor thin films are connected together by means of the weak link portion across the side surface of the thickness of the insulator layer exposed at the inside of said grooves or apertures.

Now the present invention will be described more in detail with reference to the drawings, in which.

Figure 6:
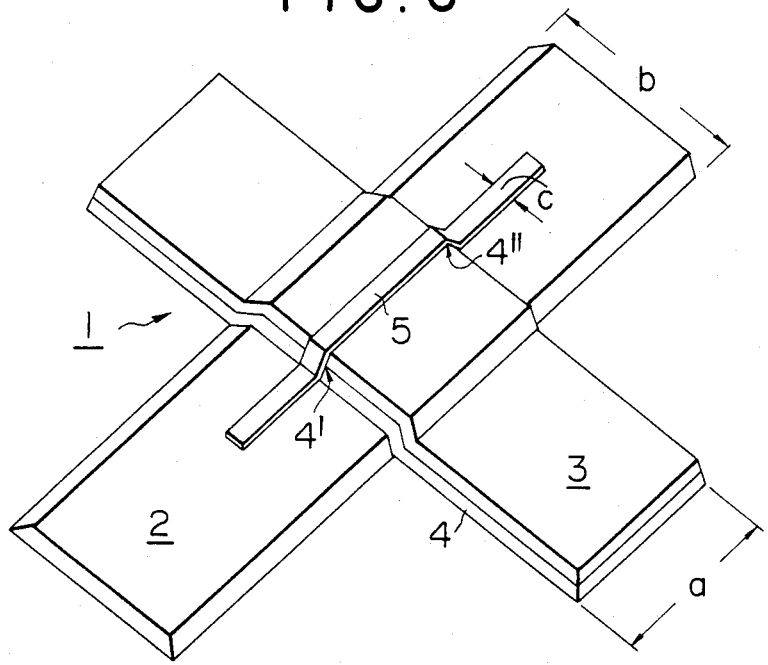
FIG. 6 and FIG. 7 are enlarged perspective views which show modified forms of the Josephson junction elements according to the present invention.
Figure 7:
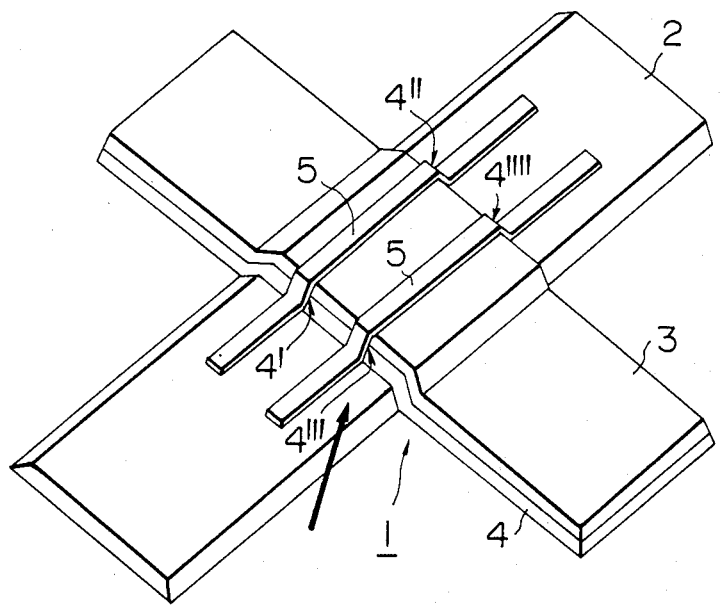
Figure 17A:
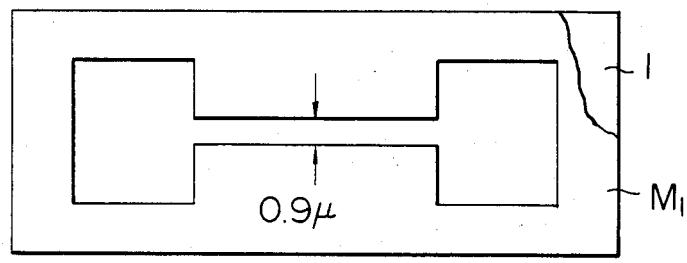
FIGS. 17A, 17B, 17C, 17D, 17E, 17F and 17G show the steps of the process for manufacturing the Josephson junction element according to the present invention.
Figure 17B:
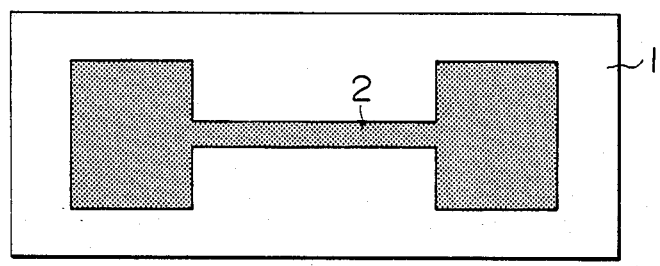
Figure 17C:
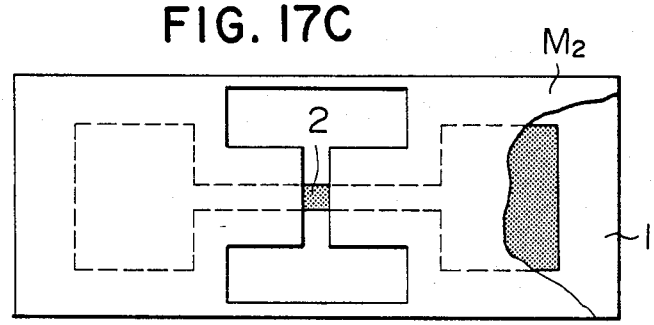
Figure 17D:
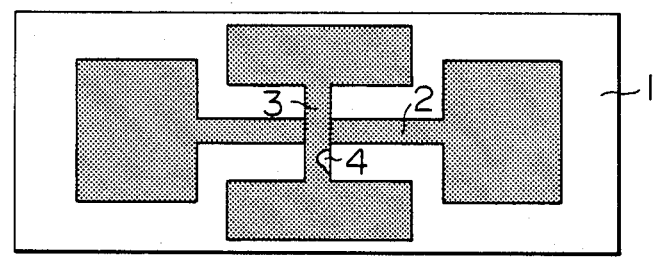
Figure 17E:
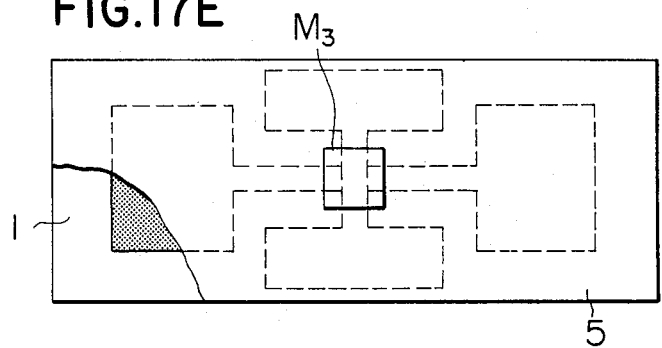
Figure 17F:
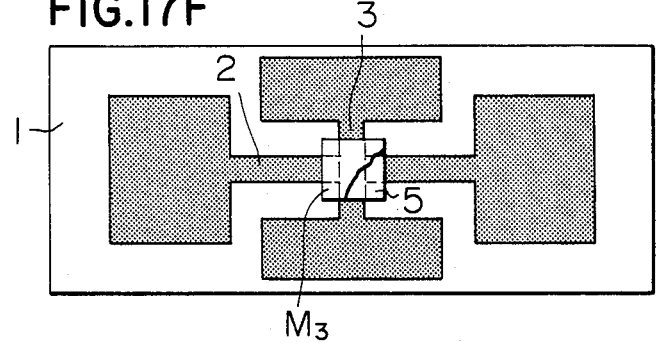
Figure 17G:
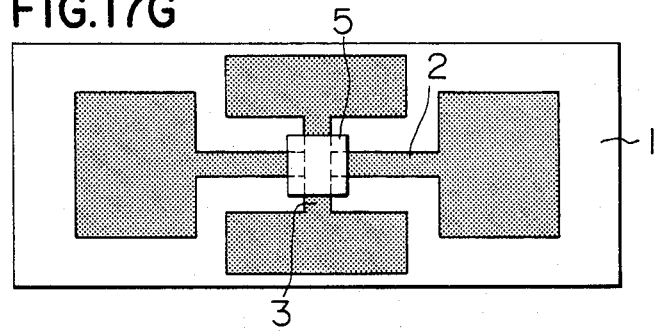

FIGS. 19E, 19F and 19G and FIGS. 20E, 20F and 20G show some steps, similar to those of FIGS. 17E, 17F and 17G, of the process for manufacturing the Josephson junction element according to the present invention shown in FIG. 6; and FIGS. 21E, 21F, 21G and FIGS. 22E, 22F, 22G show some steps, similar to those of FIGS. 17E, 17F and 17G, of the process for manufacturing the Josephson junction element according to the present invention shown in FIG. 7.

Figure 1:
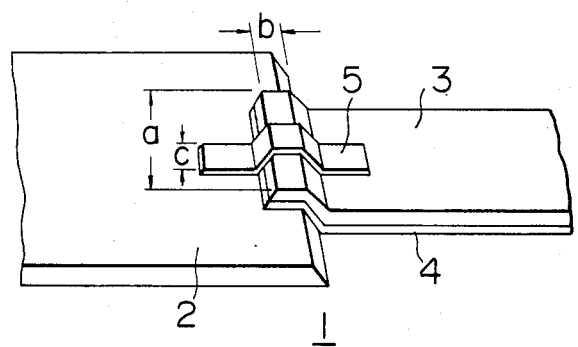
FIG. 1 is an enlarged perspective view of the conventional Josephson junction element of quasi-planar type.
Figure 3:
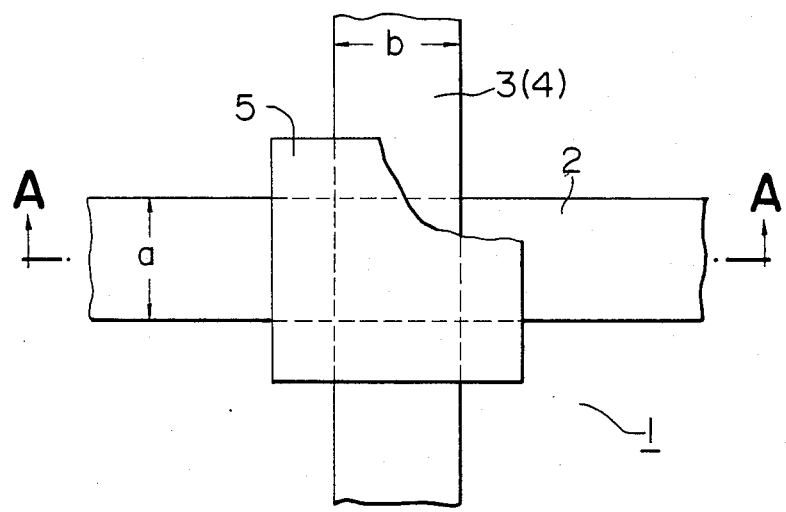
FIG. 3 is an enlarged plan view, partly broken, which shows a preferred embodiment of the Josephson junction element according to the present invention.
Figure 4:
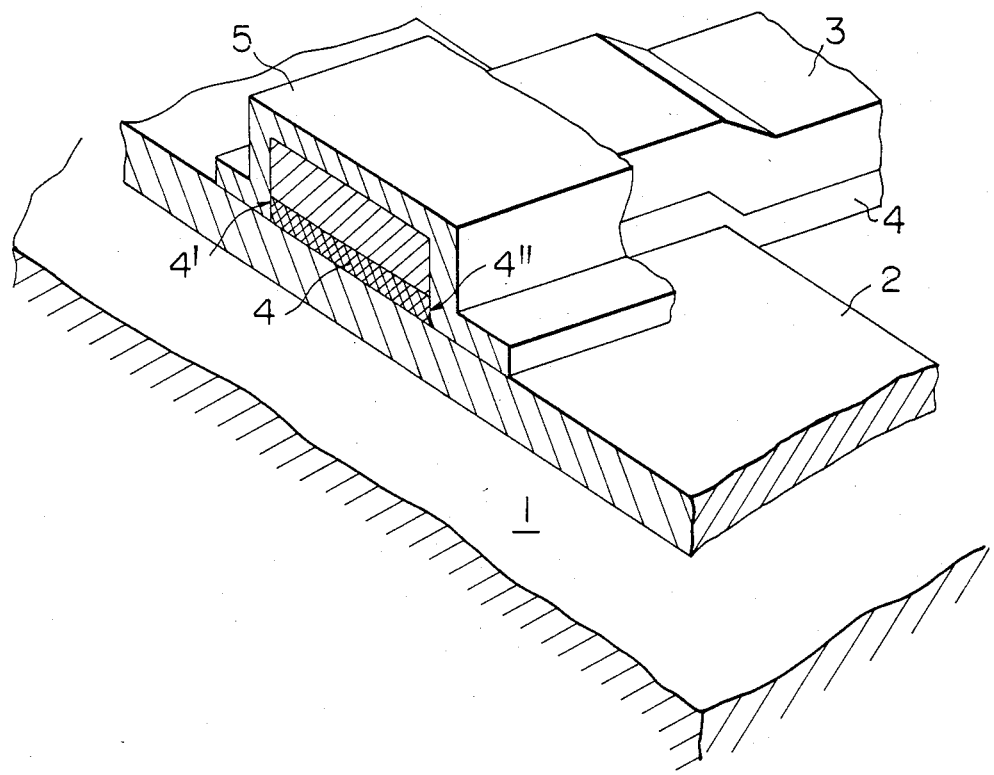
FIG. 4 is a perspective view taken along the line A—A of FIG. 3.

One embodiment of the present invention will now be described. FIG. 3 is an enlarged plan view, partly broken, showing one embodiment of a Josephson junction element according to the present invention. FIG. 4 is a cross-sectional perspective view taken along the line A—A of FIG. 3. As shown in FIGS. 3 and 4, an insulator layer 4 is arranged on a strip-like superconductor thin film 2 which extends on a substrate 1, and another superconductor thin film 3 is arranged on the insulator layer 4 in crossing relation to the underlying superconductor thin film 2. A film of barrier material is formed on the upper superconductor thin film 3 at the crossing area of the upper and lower superconductor thin films 2 and 3 and extends across the sides 4' and 4" of the thickness of said insulator layer 4 which are exposed between the upper and lower superconductor layers to form a weak link portion 5.

Thus, the two strip-like superconductor thin films are arranged in crossing relation with each other, with the insulator layer being desposed therebetween, so that the electrostatic capacity of the element can be determined depending on the width a or b of the strip-like superconductor thin films. Accordingly, if the thin films are formed in submicron width (under 1 micron), the area a×b of the crossing area can be reduced to an extremely small value smaller than 1 $\mu m^2$. This area does not vary even if the position of the superconductor thin films is deviated to some extent, and consequently a seriously precise alignment of masks in the photolithography and the electron beam lithography is not required. Accordingly, easy manufacturing of elements having small and equal capacitance can be obtained.

Also a precise alignment of the masks is not required when forming the thin film 5 of the weak link portion covering the crossing area of the superconductor thin films.

Figure 5:
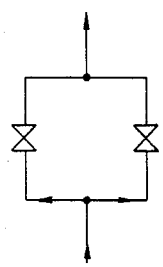
FIG. 5 is an equivalent circuit diagram of the Josephson junction element according to the present invention.

In operation of the Josephson junction element, superconducting current flows along both of the sides 4' and 4" of the insulator layer which are the short paths between the upper and lower superconductor thin films, which can be shown in the equivalent circuit having two quasi-planar Josephson junction elements connected in parallel. (FIG. 5) That is, the critical current $I_m$ which flows through the element is twice as large as the critical current of one of the quasi-planar Josephson junction elements, while the junction resistance $R_j$ is half as large as the junction resistance of one of quasi-planar Josephson junction elements, with the result that the product of $I_m \cdot R_j$ is equal to the product of $I_m \cdot R_j$ of one of the quasi-planar Josephson junction elements. Therefore, the element has a superior characteristic comparable to a single quasi-planar Josephson junction element while having much smaller capacitance than that of a single quasi-planar Josephson junction element.

Figure 2A:
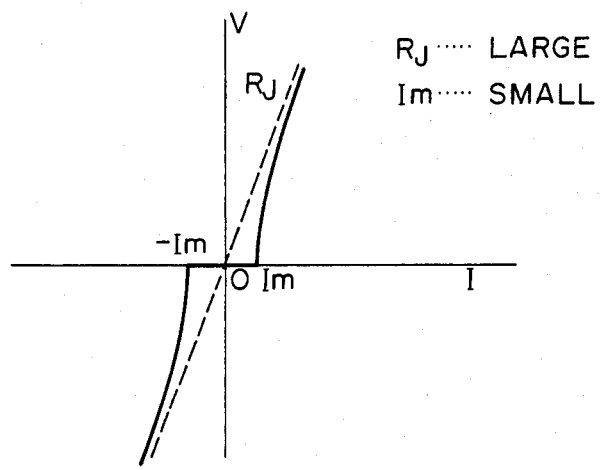
FIGS. 2A, 2B and 2C show the voltage v.s. current characteristics of the Josephson junction element.
Figure 2B:
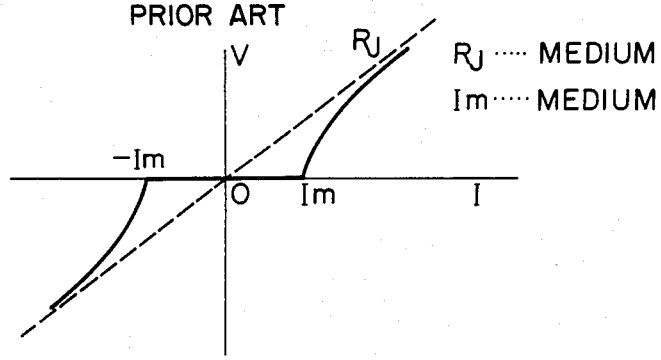

FIG. 6 shows a perspective view showing a modified form of the element shown in FIG. 3, in which a weak link portion 5 is formed by a film of barrier material in the form of a line. In this embodiment, the weak link portion 5 has a width C which is smaller than that of FIG. 3, so that it is possible to increase the junction resistance $R_j$ and to reduce the critical current $I_m$ while keeping the associated capacitance small. (Refer to FIG. 2A).

Figure 8:
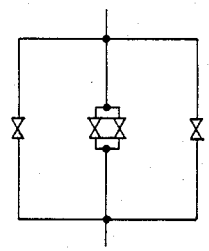
FIG. 8 is an equivalent circuit diagram of the element shown in FIG. 7.

FIG. 7 is a perspective view showing a further modification of the element shown in FIG. 3, in which a weak link portion 5 is formed by two films of barrier material in the form of a line. In operation of the element, superconducting current flows along each of the sides 4', 4'', 4''' and 4'''' of the insulator layer which are shortest paths between the upper and lower superconductor thin films, which can be shown in the equivalent circuit having four quasi-planar Josephson junction elements connected in parallel. (FIG. 8) That is, the critical current $I_m$ which flows through the element is four times as large as the critical current of one of the quasi-planar Josephson junction elements, while the junction resistance $R_j$ is one-fourth as large as the junction resistance one of the quasi-planar Josephson junction elements, with the result that the product of $I_m \cdot R_j$ is equal to the product of $I_m \cdot R_j$ of one of the quasi-planar Josephson junction elements. Therefore, the element has a superior characteristic comparable to the single quasi-planar Josephson junction element.

Figure 9A:
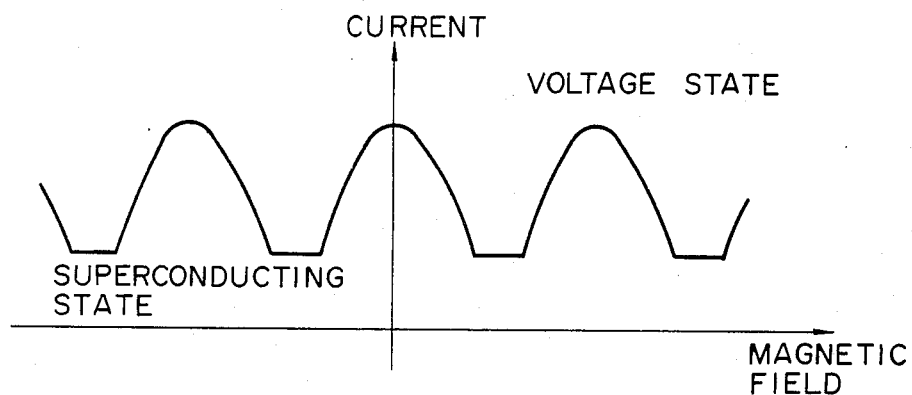
FIGS. 9A and 9B are graphs showing an example of the dependence of current upon magnetic field of the Josephson junction element.
Figure 9B:
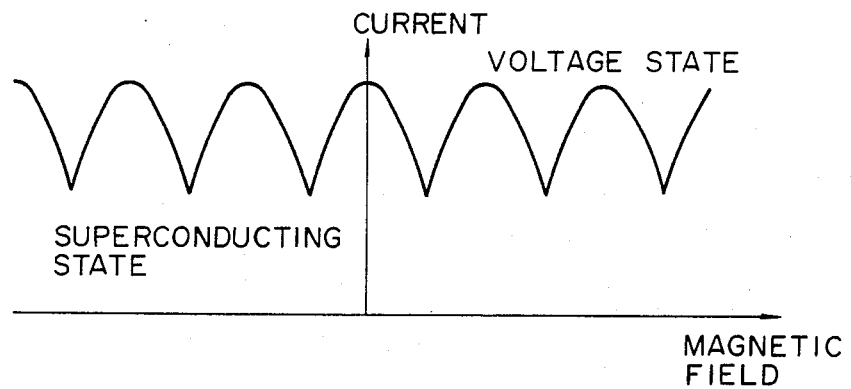

In addition, the Josephson junction element in accordance with the present invention (FIG. 7) behaves, with regard to the magnetic field extending in the direction indicated by the arrow, as though three junctions having critical current ratio 1:2:1 were connected in parallel with each other. That is, the Josephson junction element functions as a three-junction interferometer and the dependence of current upon magnetic field is as shown in a graph of FIG. 9A in which there is wide range of voltage states between peaks of the superconductive state, as compared with that of the dependence of current upon magnetic field of the two-junction interferometer as shown in FIG. 9B. Consequently, design and manufacture of the switching elements can be facilitated.

FIGS. 10-13 show enlarged plan views of further modifications of the element shown in FIG. 3, respectively. FIG. 14 is a cross-sectional perspective view taken along the line A—A of FIG. 10. FIG. 15 is a cross-sectional perspective view taken along the line A—A of FIG. 11.

Figure 10:
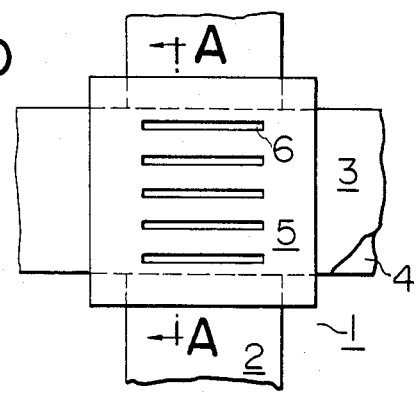
FIG. 10–FIG. 13 are enlarged plan views of embodiments of the Josephson junction elements according to the present invention.
Figure 11:
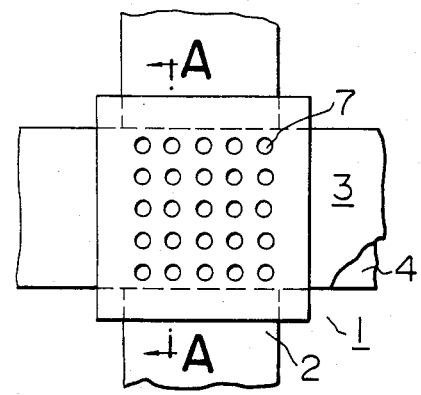
Figure 12:
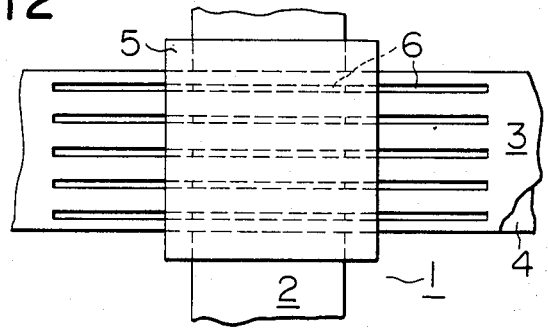
Figure 13:
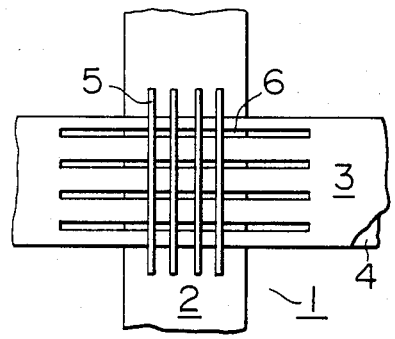
Figure 14:
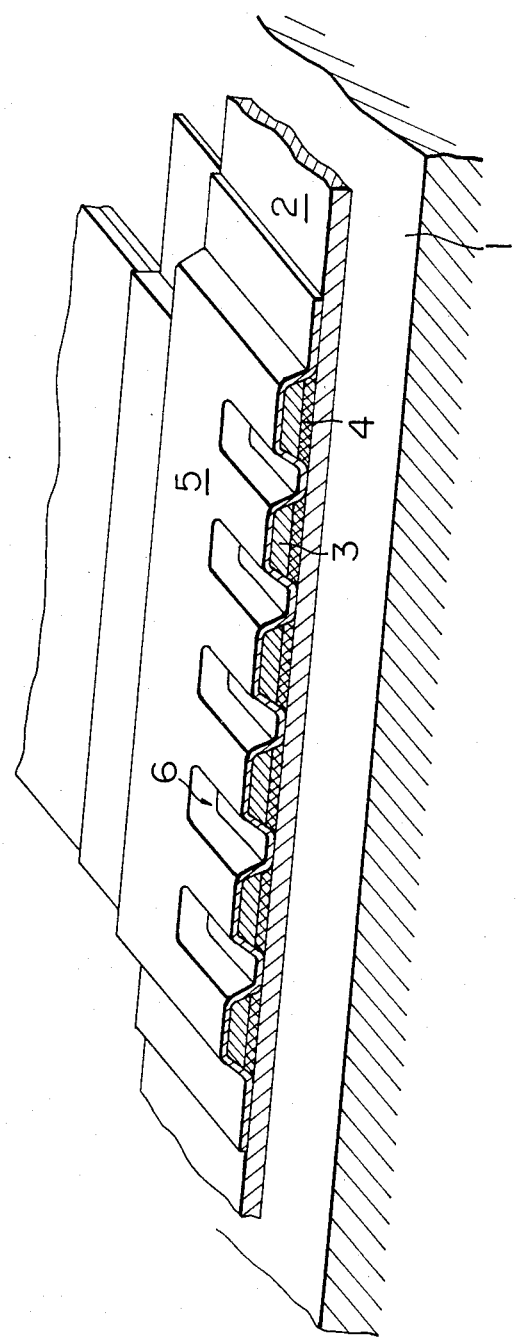
FIG. 14 is a cross-sectional perspective view taken along the line A—A of FIG. 10.
Figure 15:
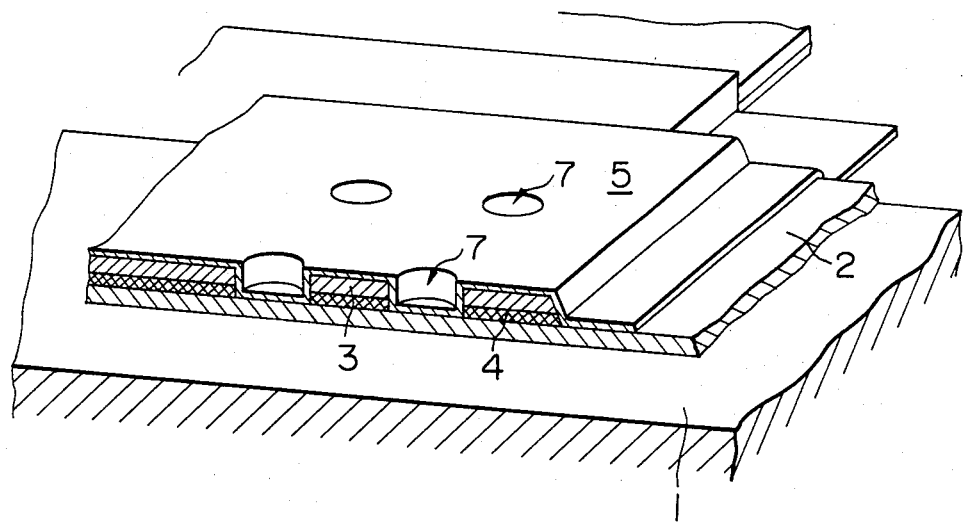
FIG. 15 is a cross-sectional perspective view taken along the line A—A of FIG. 11.

As shown in FIGS. 10-15, a first superconductor thin film 2 is arranged on a substrate 1 and a laminated body of an insulator layer 4 and a second superconductor thin film 3 is arranged on said first superconductor thin film 2. A plurality of grooves 6 or apertures 7 are formed in said laminated body and the first and second superconductor thin films 2 and 3 are connected together by a weak link portion 5 across the sides of the thickness of the insulator layer 4 exposed at said grooves or apertures. In FIGS. 10, 11 and 12, the weak link portion is formed to cover the overlapping area of the first and second superconductor thin films. In FIG. 13, a plurality of strip-like weak link portions 5 are formed at the overlapping area in crossing relation to the grooves 6.

Thus a plurality of grooves or apertures are formed in the lamination of the insulator layer and the second superconductor thin film, and both of the superconductor thin films are connected by the weak link portion on the sides of the thickness of the insulator layer which are exposed in the grooves or apertures, so that the effective width of the weak link portion which connects both of the superconductor thin films is extremely increased. In this case, the effective width of the weak link portion is increased without varying the area $a \times b$ in the junction element.

Figure 2C:
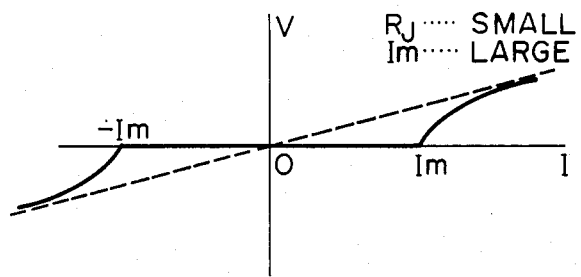
Figure 16:
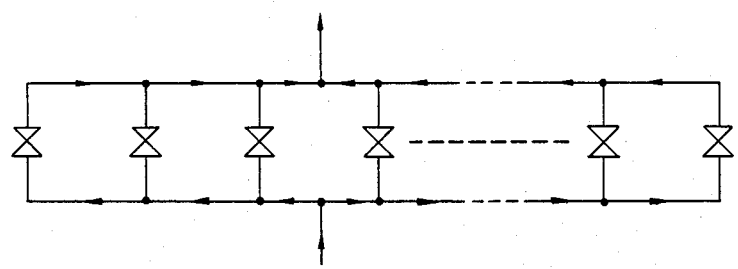
FIG. 16 is an equivalent circuit diagram of the Josephson junction element according to the present invention shown in FIG. 10–FIG. 13.

Thus, a junction element having increased critical current $I_m$ as shown in FIG. 2C while keeping small area in the junction element is obtained. That is, the equivalent circuit of the Josephson junction element thus produced includes a plurality of junction elements connected in parallel as shown in FIG. 16, so that an extremely high critical current $I_m$ is produced.

The Josephson junction element in accordance with the present invention (FIGS. 10-15) has advantages as listed below.

(i) By massproduction, a unit cost of the element can be reduced.

(ii) The degree of integration of elements on a substrate can be increased.

(iii) In an application to an electromagnetic wave generator of variable frequency type and voltage standard, even at very high frequency (very short wave length) the size of the element can be much shorter than the wavelength.

A method of producing the Josephson junction element as shown in FIG. 3 in accordance with the present invention will now be described.

Firstly, a first strip-like superconductor thin film 2 is formed on a substrate 1 through a mask. The superconductor thin film may be made of various superconductor materials exhibiting superconductivity such metals as Nb, Ta, W, La, Pb, Sn, In or Al, or alloys thereof. Referring to FIG. 17A, a photo-resist mask M1 is formed on the substrate 1 by means of photolithography or electron beam lighography, and the superconductor material is sputter-deposited or evaporated on the substrate to a thickness from several hundred Å to several thousand Å through the mask. Then the mask is removed to leave a strip-like pattern of the first superconductor thin film 2 (FIG. 17B). Both ends of the pattern are enlarged so as to make external connection easy. Next, a strip-like photo-resist mask M2 having a window is arranged on the first strip-like superconductor thin film 2 in crossing relation thereto (FIG. 17C), and an insulator material or semiconductor material such as $SiO_2$ is sputter-deposited or evaporated to a thickness from 50 Å to several thousand Å. Then the superconductor material is sputter-deposited or evaporated thereon to a thickness from several hundred Å to several thousand Å, and thereafter the mask is removed to leave a strip-like pattern of the second superconductor thin film 3 (FIG. 17D). Next, the whole area is subjected to the sputter-cleaning to remove an oxide film from the superconductor surface. And then, a barrier material is sputter-deposited or evaporated to a thickness from several hundred Å to several thousand Å on the whole surface. Thereafter, a photo-resist mask M3 is formed on the crossing area of the strip-like patterns (FIG. 17E). Now, the barrier material which is not masked is removed by chemical etching (FIG. 17F). Lastly, the photo-resist mask M3 is removed (FIG. 17G).

In this process, the photo-resist mask M2 is arranged in crossing relation to the first superconductor thin film 2 (FIG. 17C) and the insulator material is sputtered or deposited, on which the second superconductor material is sputter-deposited or evaporated thereon, using same mask M2. In this regard, it is important that the insulating material is sputter-deposited or evaporated on the strip-like superconductor thin film 2 in crossing relation thereto. On the contrary, if the thin film of insulating material were applied in overlapping relation to the whole surface of the first strip-like superconductor thin film 2, using the mask M, which was used to form the first strip-like superconductor thin film 2, a considerable disadvantage in the process of manufacturing the element would be caused. This is because it would be very difficult to selectively remove, by sputter-etching prior to forming the weak link portion, only an insulator material from other part than the overlapping area of the upper and lower, superconductor thin films, without damaging a surface of the underlying superconductor thin film. An mentioned above, the entire surface is subjected to the sputter-cleaning to remove the oxide film from the surface of the superconductor, and the shaping of the sides of the thickness of the insulator layer is also performed at this time.

The insulator layer is formed by the sputtering or evaporation of the insulator or semiconductor material, as described above. If the insulator layer has a relatively small thickness (usually, below 100 Å), pinholes may be produced in the insulator layer, which may cause superconductive shorting. In order to avoid such production of pinholes, it is preferred to subject the insulator layer to an oxidizing atmosphere to produce an oxide on the surface of said layer.

Instead of forming the insulator layer by the sputtering or evaporation of the insulator or semiconductor material, it may be possible to form an insulator layer by subjecting the surface of the super conductor thin film 2 exposed through the window of the mask M2 to an oxidizing atmosphere to oxidize said surface.

Now, three other embodiments of series connections of the Josephson junction elements in accordance with the present invention will be described referring to FIG. 18.

Figure 18A:
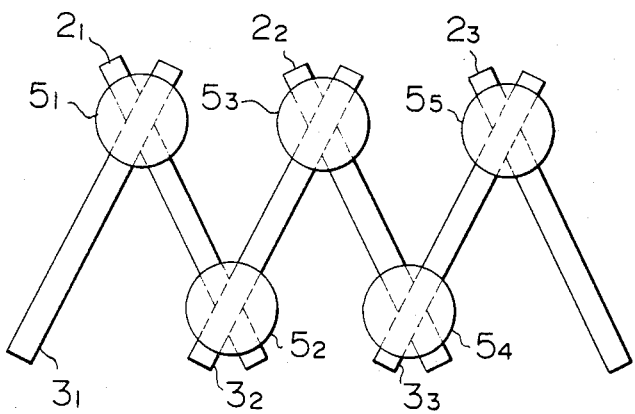
FIGS. 18A, 18B and 18C show embodiments of series connections of the Josephson junction elements according to the present invention.
Figure 18B:
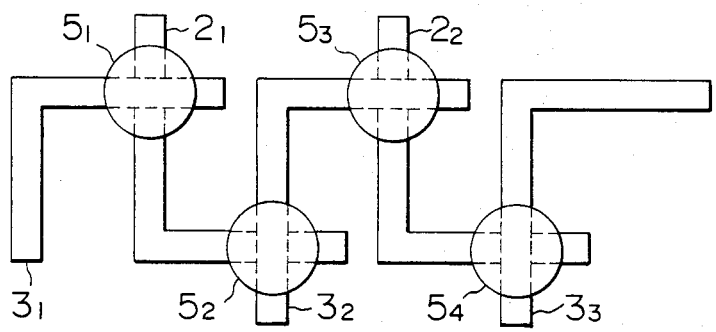
Figure 18C:
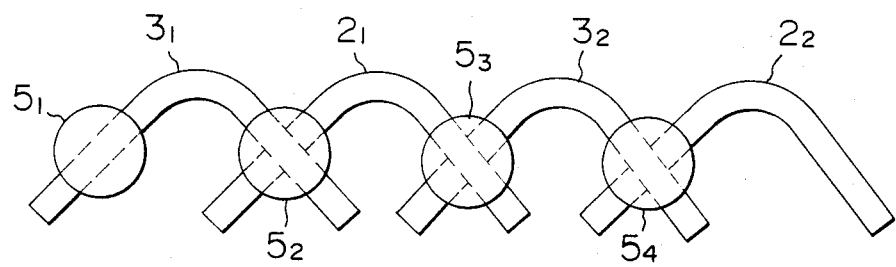

In FIG. 18, a plurality of lower superconductor thin films $2_1$, $2_2$ and $2_3$ are arranged at intervals and a plurality of upper superconductor thin films $3_1$, $3_2$ and $3_3$ are arranged on the lower superconductor thin films in bridging and crossing relation thereto, with insulator layers being disposed therebetween adjacent the superconductor thin films 2. The upper and lower thin films are connected together by weak link portions $5_1$, $5_2$, $5_3$, $5_4$, and $5_5$ which extend across the sides of the thickness of the insulator layers. With the arrangement of the series connections of the Josephson junction elements, thus produced, the capacitance of the whole series connections of the elements is decreased in inverse proportion to the number of the elements, while the resistance thereof is increased in proportion to the number of the elements because the capacitances in the overlapping areas are connected in series. Increasing the resistance is advantageous for impedance-matching in the application to an electromagnetic wave detector, for instance. Such arrangement of the connections of elements is particularly effective to decrease the times of sputtering or evaporation and is advantageous for manufacturing the elements. That is to say, the connections can be formed by the following process. Firstly, the first superconductor thin films $2_1$, $2_2$, $2_3$, $2_4$, $2_5$ . . . are formed on a substrate by sputtering or deposition through a photo-resist mask. Next, the insulator layers and the second superconductor thin films ($3_1$, $3_2$, $3_3$, $3_4$, $3_5$ . . . ) are formed thereon by sputtering or evaporation so as to bridge two adjacent first superconductor thin films ($2_1$, $2_2$: $2_2$, $2_3$: $2_3$, $2_4$ . . . ). Finally, weak link portions are formed at the respective overlapping areas to complete the process. Thus, it is apparent that a series connection of the elements can be formed by sputtering or evaporation only four times regardless of the number of elements.

Now the method for manufacturing the Josephson junction element of the type shown in FIG. (6) will be described. The initial steps of this method are same as those shown in FIGS. 17A–17D, and therefore the description of these initial steps are omitted, and only the subsequent steps will be described with reference to FIG. 19.

Figure 19E:
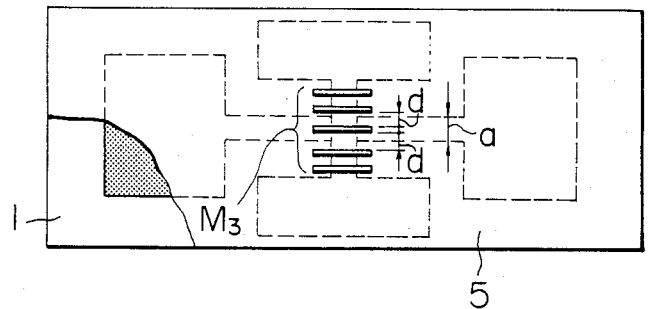
Figure 19F:
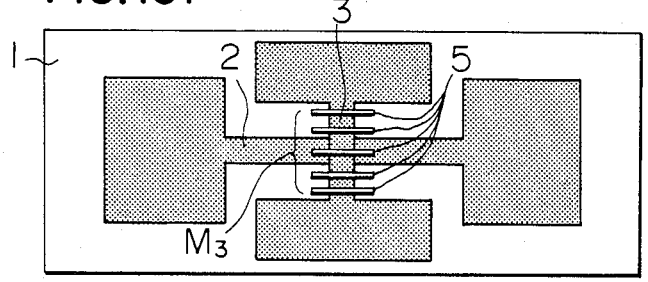

At the crossing area of the strip-like patterns produced by the steps of FIGS. 17A–17D, a plurality of photo-resist masks M3 are formed in the form of lines arranged in parallel relation with each other at distances d narrower than the width a of the first strip-like superconductor thin film 2 (FIG. 19E). The barrier material which is not covered by the masks is removed by the chemical etching process (FIG. 19F). Finally the photo-resist mask M3 is removed (FIG. 19G).

Figure 19G:
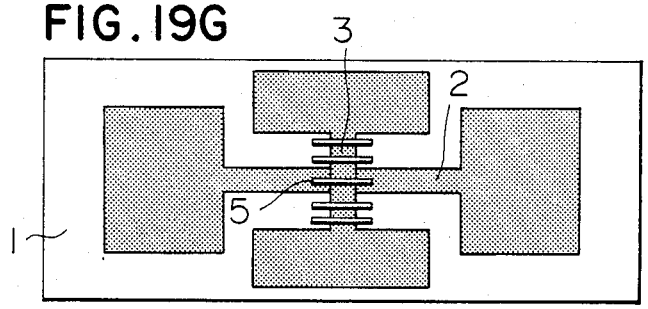
Figure 20E:
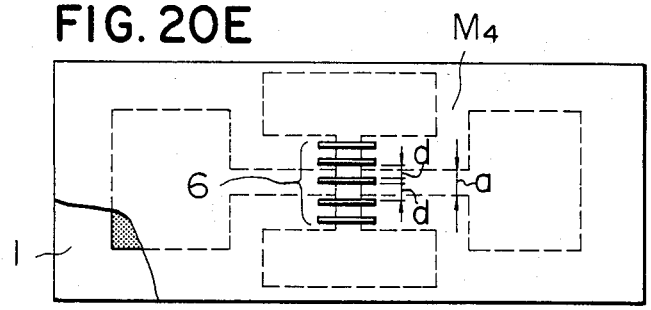
Figure 20F:
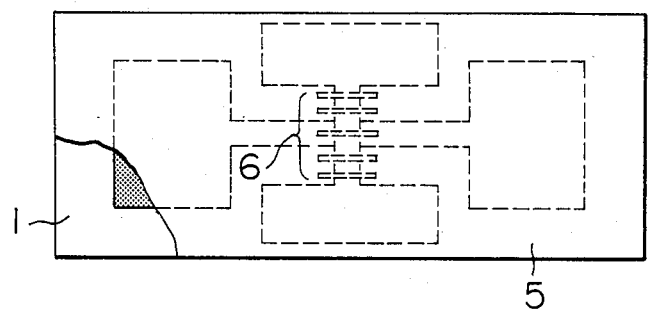
Figure 20G:
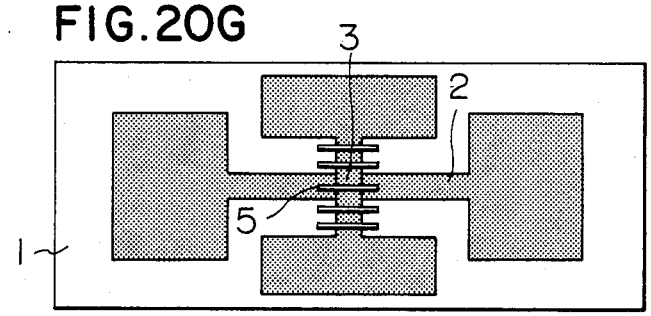

The steps as shown in FIGS. 20E, 20F and 20G may be used in place of the steps as shown in FIGS. 19E, 19F and 19G. A photo-resist mask M4 having a plurality of windows 6 in the form of lines which extend in parallel with each other at distances d narrower than the width a of the first strip-like superconductor thin film 2 is arranged on the first strip-like superconductor thin film 2 (FIG. 20E), and after the whole surface is subjected to the sputter-cleaning, weak link material is sputter-deposited or evaporated through the windows 6 of the photo-resist mask M4 (FIG. 20F). Next, the photo-resist mask M4 is removed and the weak link material is stripped (lifted off), thereby completing the junction element (FIG. 20G).

It is essential in the above manufacturing process to use a plurality of photo-resist masks M3 in the form of lines in parallel with each other at distances d narrower than the width a of the first strip-like superconductor thin film or to use a photo-resist mask M4 having windows (FIG. 19E or FIG. 20E). That is, if only the condition d<a is satisfied, the weak link portion 5 having smaller width c can be formed in a reliable manner at the crossing area of two superconductor thin films 2 and 3, without requiring particularly precise alignment of the photo-resist masks M3 or M4, and consequently a junction element having high junction resistance $R_j$ can be easily produced.

The barrier material 5 formed on the part other than the crossing area, which does not connect the both superconductor layers 2 and 3, has no influence on the characteristics of the junction element.

Figure 21E:
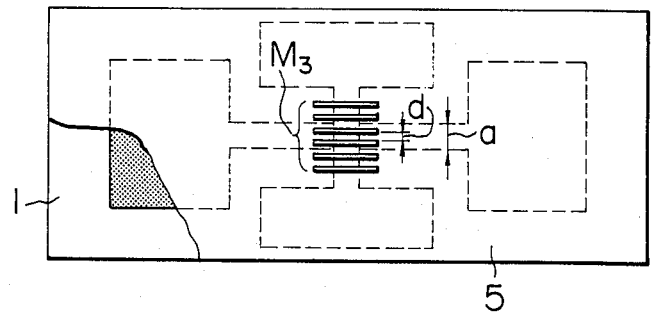
Figure 21F:
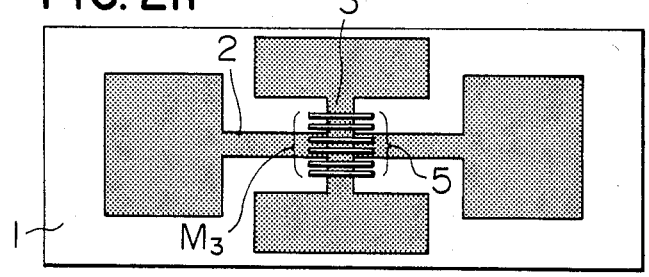
Figure 21G:
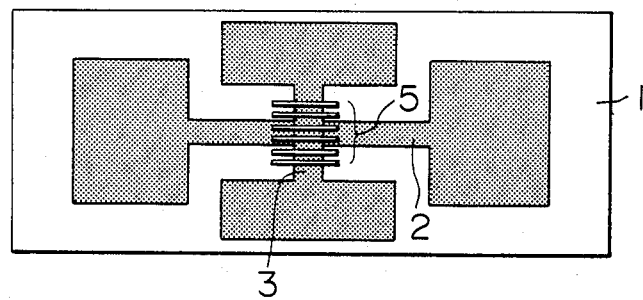
Figure 22E:
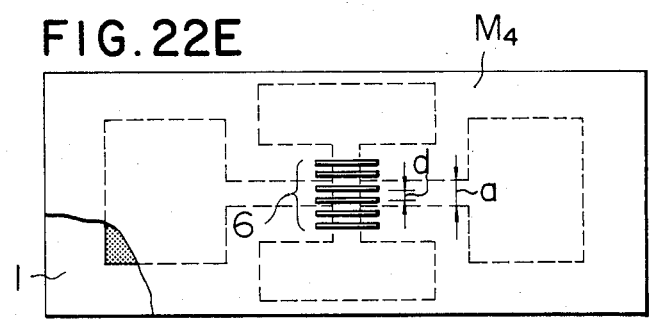
Figure 22F:
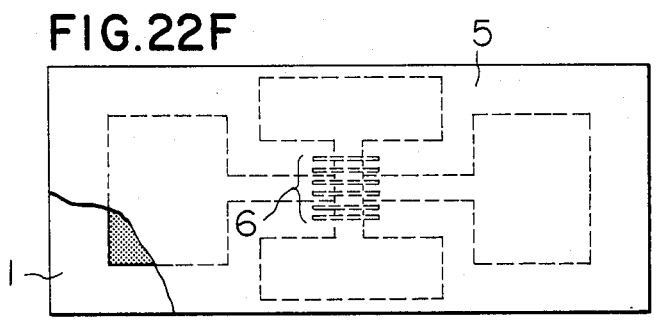
Figure 22G:
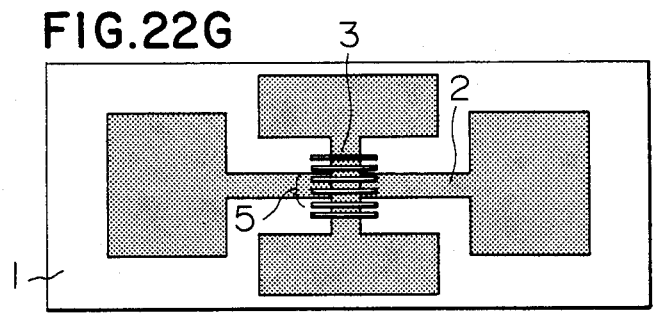

The method for manufacturing the Josephson junction element as shown in FIG. 7 is substantially identical with that for manufacturing the element as shown in FIG. 6, and therefore only the difference of the former from the latter will be described. FIGS. 21E, 21F and 21G correspond to FIGS. 19E 19F and 19G, respectively, and FIGS. 22E, 22F and 22G correspond to FIGS. 20E, 20F and 20G respectively. The difference resides in the fact that a photo-resist masks M3 in the form of lines extending in parallel with each other at distances d narrower than ½ of the width a of the first strip-like superconductor thin film or a photo-resist mask M4 having windows in the form of lines extending in parallel with each other at distances d narrower than ½ of the width a of the first strip-like superconductor thin film are used, as shown in FIG. 21E and FIG. 22E. In such case, if the condition $d < \frac{1}{2} \cdot a$ is satisfied, the weak link portion 5 having small width c can be formed in reliable manner at the crossing area of the both superconductor thin films 2 and 3, without requiring particularly precise alignment of the photo-resist masks M3 or M4, so that a junction element having high junction resistance $R_j$ can be easily produced.

I claim:

1. A Josephson junction element comprising a lower strip-like superconductor thin film, an upper strip-like superconductor thin film arranged at an angle to and in crossing relation to said lower superconductor thin film at a crossing area, an insulator layer arranged between said upper and lower superconductor thin films at a region within the crossing area thereof, and a weak link extending across the sides of said insulator layer and at least one of the superconducting thin films at the respective opposite edges of the crossing area and connecting the upper and lower superconductor thin films with each other.

2. A Josephson junction element according to claim 1, in which said weak link is in the form of a line.

3. A Josephson junction element according to claim 1, in which said weak link consists of two weak link elements in the form of lines.

4. A Josephson junction element comprising a substrate; a first superconductor thin film arranged on said substrate; a double laminated body including an insulator layer located on the first superconductor thin film and a second superconductor thin film arranged on said insulator layer and having a plurality of spaced openings therein extending at least through said second superconductor film and said insulator layer separated by spaced elongated segments of said second superconductor film and said insulator layer; and a weak link extending at an angle to and across the spaced elongated segments of said second superconductor film and said insulator layer exposed at the sides of said openings and connecting said first and second superconductor thin films with each other.

5. A series of Josephson junction elements comprising a plurality of strip-like first superconductor thin films arranged at spaced intervals, a plurality of second superconductor strip-like thin films disposed at an angle to and bridging two adjacent first superconductor thin films, respectively, and arranged on said first superconductor thin films in crossing relation thereto, an insulator layer arranged between said first and second superconductor thin films at a crossing region within each of the crossing areas thereof, and a plurality of weak links extending across at least two sides of the crossing regions of said insulator layers and one of the superconductor thin films and connecting said first and second superconductor thin films with each other in said regions.

6. A Josephson junction element according to claim 1, in which the weak link is made of a material selected from the group consisting of a superconductor, a normal metal, a semimetal, and a semiconductor.

* * * * *